United States Patent
Ito et al.

(10) Patent No.: US 10,840,261 B2
(45) Date of Patent: Nov. 17, 2020

(54) SEMICONDUCTOR STORAGE DEVICE

(71) Applicant: TOSHIBA MEMORY CORPORATION, Minato-ku (JP)

(72) Inventors: Takamasa Ito, Nagoya (JP); Ken Komiya, Nagoya (JP); Tsuneo Uenaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/285,892

(22) Filed: Feb. 26, 2019

(65) Prior Publication Data

US 2020/0075623 A1 Mar. 5, 2020

(30) Foreign Application Priority Data

Aug. 30, 2018 (JP) .................................. 2018-161865

(51) Int. Cl.
| | |
|---|---|
| *H01L 27/11582* | (2017.01) |
| *H01L 23/528* | (2006.01) |
| *H01L 23/532* | (2006.01) |
| *H01L 27/1157* | (2017.01) |
| *H01L 29/10* | (2006.01) |
| *H01L 27/11565* | (2017.01) |

(52) U.S. Cl.
CPC ...... *H01L 27/11582* (2013.01); *H01L 23/528* (2013.01); *H01L 23/53257* (2013.01); *H01L 23/53271* (2013.01); *H01L 23/53295* (2013.01); *H01L 27/1157* (2013.01); *H01L 29/1037* (2013.01); *H01L 27/11565* (2013.01)

(58) Field of Classification Search
CPC ............. H01L 27/11582; H01L 23/528; H01L 23/53257; H01L 23/53295; H01L 27/1157; H01L 23/53271; H01L 29/1037; H01L 27/11565
USPC ........ 257/315, 316, 324; 438/201, 211, 216, 438/257
See application file for complete search history.

(56) References Cited

U.S. PATENT DOCUMENTS

| | | |
|---|---|---|
| 9,960,173 B2 | 5/2018 | Shimojo |
| 2016/0329343 A1 | 11/2016 | Pachamuthu et al. |
| | (Continued) | |

FOREIGN PATENT DOCUMENTS

JP 2017-163057 9/2017

*Primary Examiner* — Thinh T Nguyen
(74) *Attorney, Agent, or Firm* — Oblon, McClelland, Maier & Neustadt, L.L.P.

(57) ABSTRACT

A semiconductor storage device includes a base portion, a stacked body, and a first column. The base portion includes a substrate, a semiconductor element on the substrate, lower-layer wiring above the semiconductor element, and a first conductive layer above the lower-layer wiring and made of a metal compound or polycrystal silicon. The stacked body is above the first conductive layer. The stacked body includes second conductive layers and insulating films stacked alternately. The first column includes a semiconductor body and a memory film. The semiconductor body extends in a stacked direction of the stacked body and is electrically connected to the first conductive layer. A memory film has a charge trap between the plurality of second conductive layers and the semiconductor body. The first conductive layer is provided between the stacked body and the lower-layer wiring, and between a peripheral region of the stacked body and the lower-layer wiring.

15 Claims, 8 Drawing Sheets

(56) References Cited

U.S. PATENT DOCUMENTS

2017/0179026 A1    6/2017   Toyama et al.
2017/0263618 A1*   9/2017   Shimojo ........... H01L 27/11548
2018/0301374 A1*  10/2018   Masamori et al. .........................
                                                    H01L 21/76877

* cited by examiner

SEMICONDUCTOR STORAGE DEVICE

CROSS REFERENCE TO RELATED APPLICATIONS

This application is based upon and claims the benefit of priority from the prior Japanese Patent Application No. 2018-161865, filed on Aug. 30, 2018, the entire contents of which are incorporated herein by reference.

FIELD

The embodiments of the present invention relate to a semiconductor storage device.

BACKGROUND

A non-volatile memory, which has a stacked body of a three-dimensional configuration having insulating films and conductive films alternately stacked as a memory cell array, has been developed. A control circuit for controlling such a memory cell array may be provided under the stacked body of the three-dimensional configuration or at the periphery of the stacked body. In this case, lower-layer wiring connected to the control circuit is provided under the memory cell array and a peripheral region of the memory cell array.

In the formation process of the memory cell array, if a dust is attached on the stacked body when memory holes, slits, etc. are formed in the stacked body, it is difficult to form a resist mask in a region of the dust. Moreover, if the dust is removed, an undesired hole pattern is formed at the portion where the dust was attached. Therefore, in the formation process of memory holes, slits, etc., a hole pattern deep like the memory holes and slits is formed unintentionally at the portion where the dust was formed. If such a hole pattern caused by the dust reaches the lower-layer wiring, a problem occurs such that a metal material used for the lower-layer wiring is oxidized to expand in the following thermal process, which causes cracks in the lower-layer wiring.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface perpendicular to a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor storage device according to the present embodiment includes a base portion, a stacked body, and a first columnar portion. The base portion includes a substrate, a semiconductor element provided on the substrate, lower-layer wiring provided above the semiconductor element, and a first conductive layer provided above the lower-layer wiring and made of a metal compound or polycrystal silicon. The stacked body is provided above the first conductive layer, the stacked body including a plurality of second conductive layers and a plurality of insulating films stacked alternately. The first columnar portion includes a semiconductor body extending in a stacked direction of the stacked body and electrically connected to the first conductive layer, and a memory film having a charge trap between the plurality of second conductive layers and the semiconductor body. The first conductive layer is provided at least between the stacked body and the lower-layer wiring, and between a peripheral region of the stacked body and the lower-layer wiring.

First Embodiment

Figure 1:
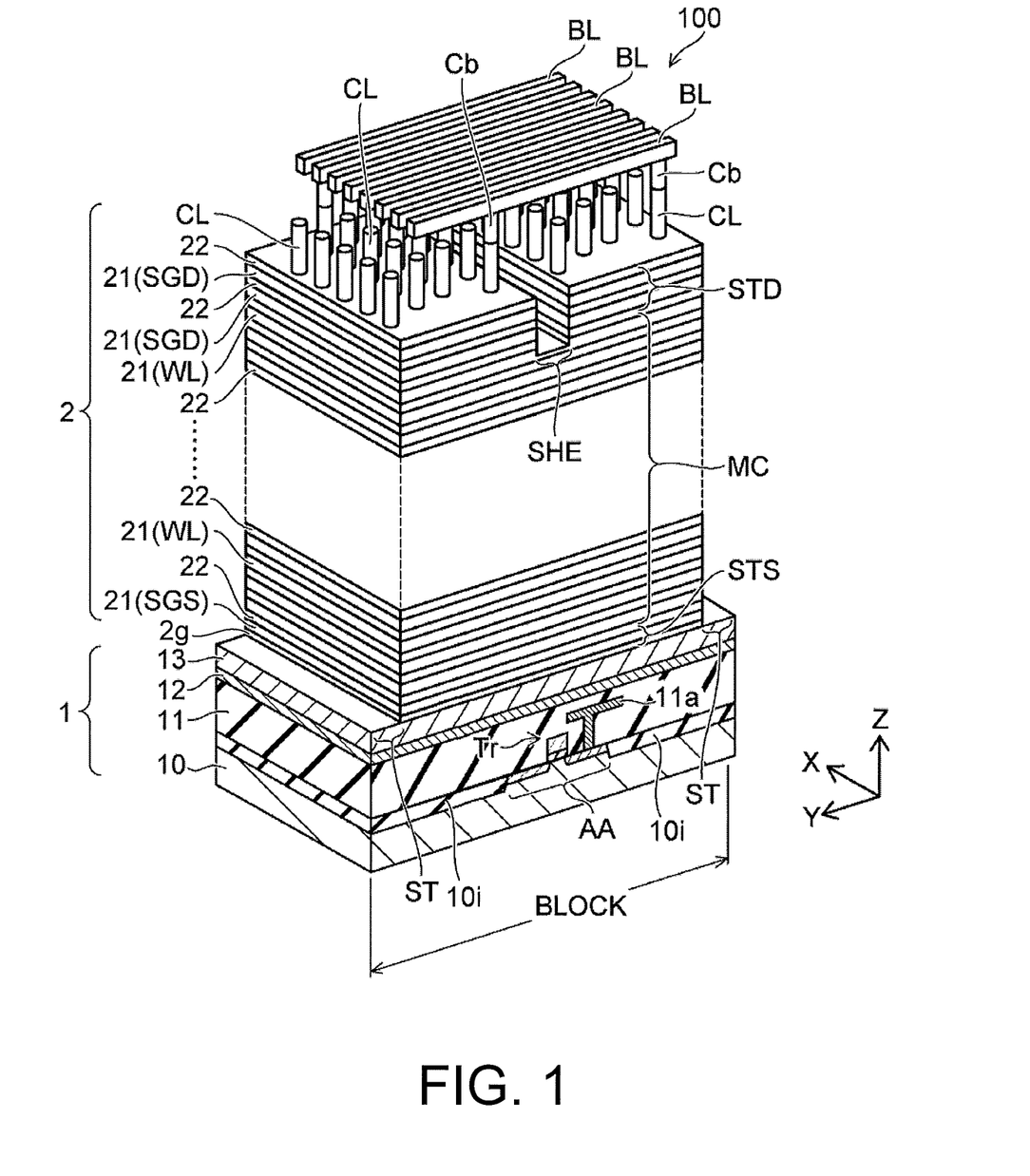
FIG. 1 is a schematic perspective view exemplifying a semiconductor storage device according to a first embodiment.

FIG. 1 is a schematic perspective view exemplifying an example of a semiconductor storage device 100 according to a first embodiment. The stacked direction of a stacked body 2 is defined as a Z-axis direction. One direction that intersects (for example, crossing at right angles) with the Z-axis direction is defined as, for example, a Y-axis direction. One direction that intersects (for example, crossing at right angles) with each of the Z- and Y-axis directions is defined as, for example, an X-axis direction.

The semiconductor storage device 100 according to the first embodiment is a non-volatile memory having memory cells of a three-dimensional configuration. As shown in FIG. 1, the semiconductor storage device 100 includes a base portion 1, a stacked body 2, a plurality of first columnar portions CL, and a plurality of bit lines BL.

The base portion 1 includes a substrate 10, a first insulating film 11, and first conductive layers 12 and 13. The first insulating film 11 is provided on the substrate 10. The first conductive layers 12 and 13 include a lower conductive layer 12 and an upper conductive layer 13. The lower conductive layer 12 is provided on the first insulating film 11. The upper conductive layer 13 is provided on the lower conductive layer 12. The substrate 10 is, for example, a silicon substrate. The conductivity type of silicon (Si) of the substrate 10 is, for example, a p-type. On the surface area of the substrate 10, for example, an element isolation region 10i is provided. The element isolation region 10i is for example, an insulating region including silicon oxide and defines active areas AA on the surface area of the substrate 10. Semiconductor elements are provided on the substrate 10 in the active area AA. The semiconductor elements are, for example, transistors Tr. The source and drain regions of the transistors Tr are provided in the active area AA. The transistors Tr constitute a peripheral circuit of the non-volatile memory. The first insulating film 11 contains, for example, silicon oxide (SiO2), to cover and protect the transistors Tr. Lower-layer wiring 11a is provided inside the first insulating film 11. The lower-layer wiring 11a is electrically connected to the semiconductor elements such as the transistors Tr.

In the present embodiment, the first conductive layers 12 and 13 are a stacked film including the lower conductive layer 12 and the upper conductive layer 13. The lower conductive layer 12 contains a conductive metal (for example, tungsten) or metal silicide (for example, tungsten silicide (WSi)). The upper conductive layer 13 contains, for example, n-type doped polysilicon. Part of the upper conductive layer 13 may be undoped polysilicon. The first conductive layers 12 and 13 are connected to the first columnar portions CL to function as a common source line (BSL (Buried Source Line)).

The stacked body 2 is located above (in the Z-axis direction) the first conductive layers 12 and 13. The stacked body 2 includes a plurality of second conductive layers 21 and a plurality of insulating films 22 alternately along the Z-axis direction. Each second conductive layer 21 contains, for example, a conductive metal such as, tungsten. Each insulating film 22 contains, for example, silicon oxide. Each insulating film 22 is provided between the plurality of second conductive layer 21 adjacent to each other in the Z-direction, to isolate the second conductive layers 21 from each other. The number of stacks of each of the second conductive layers 21 and the insulating films 22 can be decided freely. The insulating films 22 may, for example, be cavities (gaps).

Between the stacked body 2 and the upper conductive layer 13, for example, an insulating film 2g is provided. The insulating film 2g may, for example, be silicon oxide (SiO2). The insulating film 2g may contain a high dielectric that is higher in dielectric constant than the silicon oxide. The high dielectric is, for example, a metal oxide.

The second conductive layers 21 include at least one source-side selection gate SGS, a plurality of word lines WL, and at least one drain-side selection gate SGD. The source-side selection gate SGS is a gate electrode of a source-side selection transistor STS. The word lines WL are gate electrodes of memory cells MC. The drain-side selection gate SGD is a gate electrode of a drain-side selection transistor STD. The source-side selection gate SGS is provided in a lower region of the stacked body 2. The drain-side selection gate SGD is provided in an upper region of the stacked body 2. The lower region is a region of the stacked body 2 closer to the base portion 1 whereas the upper region is a region of the stacked body 2 far from the base portion 1. The word lines WL are provided between the source-side selection gate SGS and the drain-side selection gate SGD.

Among the plurality of insulating films 22, the insulating film 22, which isolates the source-side selection gate SGS and the associated word line WL from each other, may have a larger thickness than the thickness of, for example, the insulating film 22 which insulates the adjacent word lines WL from each other, in the Z-axis direction. Moreover, on the uppermost insulating film 22, a cover insulating film (not shown) may be provided. The cover insulating film contains, for example, silicon oxide.

The semiconductor storage device 100 has a plurality of memory cells MC connected in series between the source-side selection transistor STS and the drain-side selection transistor STD. The configuration of the source-side selection transistor STS, the memory cells MC, and the drain-side selection transistor STD connected in series one another is referred to as a "memory string" or a "NAND string". The memory string is, for example, connected to the bit lines BL via contacts Cb. The bit lines BL are provided above the stacked body 2 and extend in the Y-axis direction.

Figure 2:
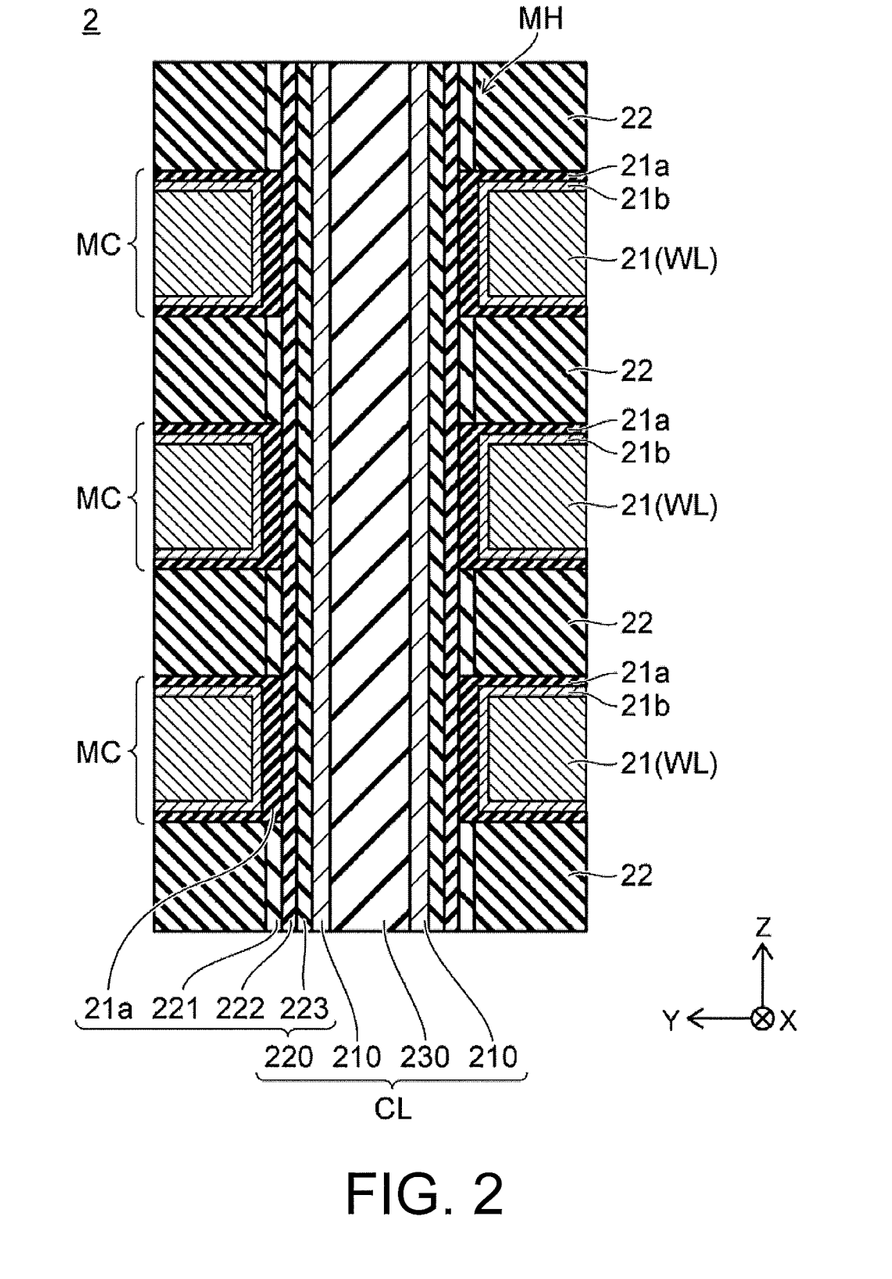
FIG. 2 is a schematic sectional view exemplifying a first columnar portion.
Figure 3:
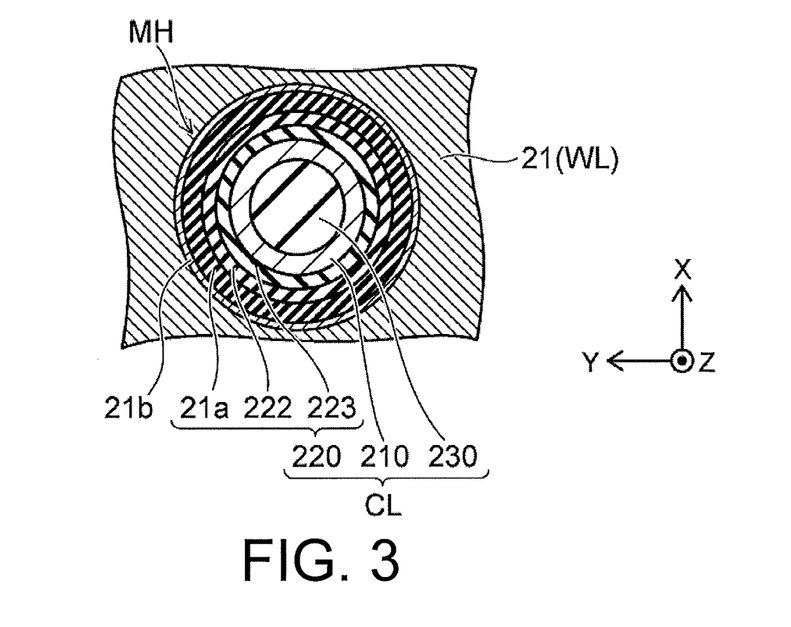
FIG. 3 is a schematic plan view exemplifying the first columnar portion.
Figure 5:
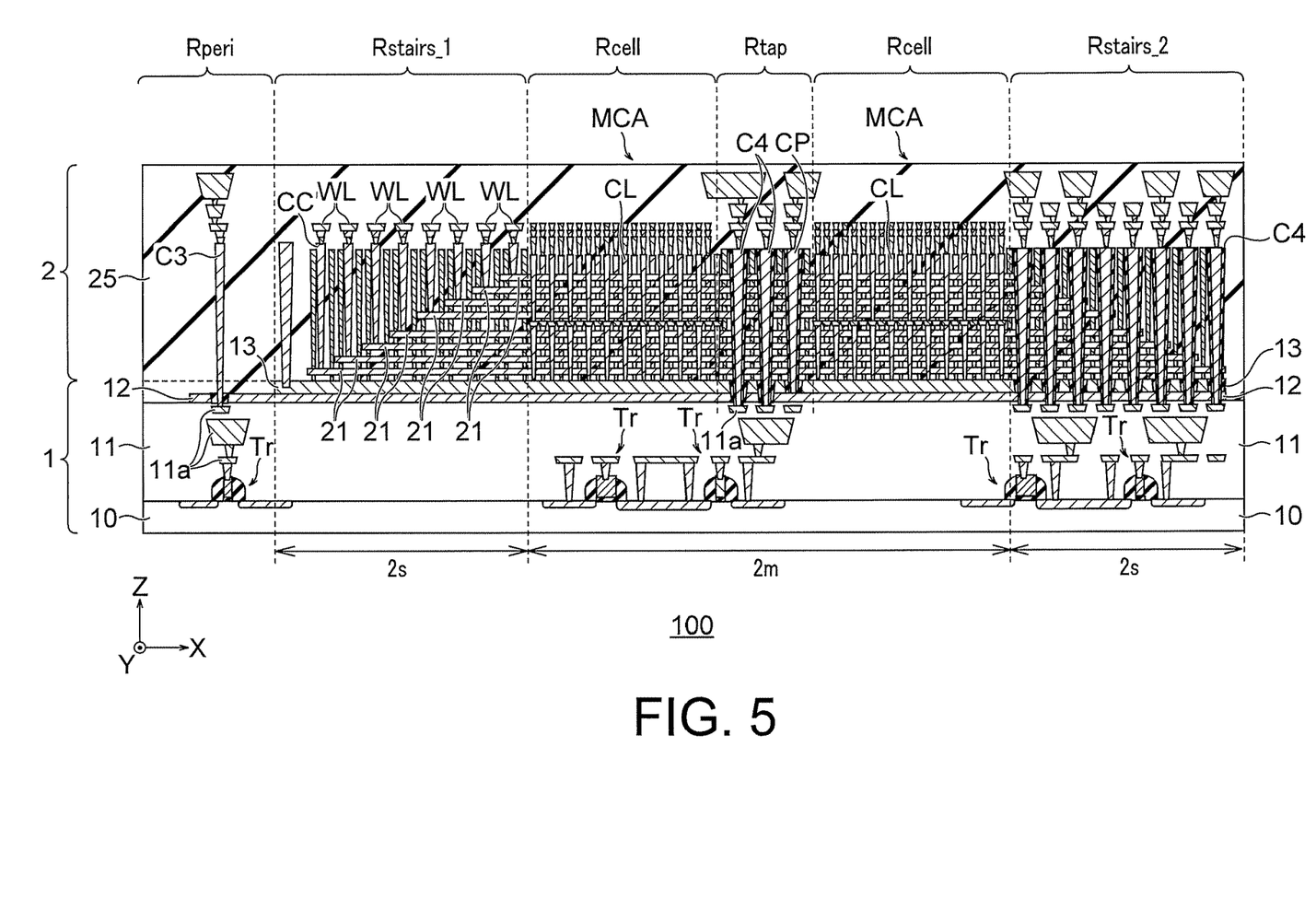
FIG. 5 is a schematic sectional view taken on line 5-5 of FIG. 4.

FIG. 2 is a schematic sectional view exemplifying each first columnar portion CL. FIG. 3 is a schematic plan view exemplifying each first columnar portion CL. A memory hole MH is provided penetrating the stacked body 2 along the Z-axis direction from an upper end of the stacked body 2, and provided inside the stacked body 2 up to the upper conductive layer 13. The plurality of first columnar portions CL each include a semiconductor body 210, a memory film 220, and a core layer 230. The semiconductor body 210 is electrically connected to the upper conductive layer 13. The memory film 220 has a charge trap between the semiconductor body 210 and each second conductive layer 21. The plurality of first columnar portions CL each one selected from each finger are connected together to one bit line BL via the contacts Cb of FIG. 1. As shown in FIG. 5, each first columnar portion CL is, for example, provided in a cell region Rcell.

As shown in FIGS. 2 and 3, in the X-Y plane, the memory hole MH has a circular or an oval shape, for example. A blocking insulating film 21a, which is part of the memory film 220, may be provided between each second conductive film 21 and the associated insulating layer 22. The blocking insulating film 21a is, for example, a silicon oxide film or a metal oxide film. One example of the metal oxide film is aluminum oxide. A barrier film 21b may be provided between each second conductive layer 21 and the associated insulating layer 22, and between the second conductive layer 21 and the memory film 220. As for the barrier film 21b, when the second conductive layer 21 is tungsten, for example, a stacked film of titanium nitride and titanium is selected. The blocking insulating film 21a restricts charge back-tunneling from the second conductive layer 21 to the memory film 220. The barrier film 21b enhances adhesiveness between the second conductive layer 21 and the blocking insulating film 21a.

The semiconductor body 210 has a tubular shape having a closed bottom, for example. The semiconductor body 210 contains silicon, for example, which is, for example, polysilicon that is crystallized amorphous silicon. The semiconductor body 210 is, for example, undoped silicon. Moreover, the semiconductor body 210 may be p-type silicon. The semiconductor body 210 functions as a channel of each of the drain-side selection transistor STD, the memory cells MC, and the source-side selection transistor STS.

The components of the memory film 220, except for the blocking insulating film 21a, are provided between the inner wall of the memory hole MH and the semiconductor body 210. The memory film 220 has a tubular shape, for example. The plurality of memory cells MC have a memory area between the semiconductor body 210 and each second conductive layer 21 that functions as a word line WL, stacked one another in the Z-axis direction. The memory film 220, for example, includes a cover insulating film 221, a charge trapping film 222, and a tunnel insulating film 223. Each of the semiconductor body 210, the charge trapping film 222, and the tunnel insulating film 223 extends in the Z-axis direction.

The cover insulating film 221 is provided between each insulating layer 22 and the charge trapping film 222. The cover insulating film 221 contains silicon oxide, for example. The cover insulating film 221 protects the charge trapping film 222 so as not to be etched when replacing a sacrifice film (not shown) with each conductive layer 21 (a replacement process). The cover insulating film 221 may be removed from between the second conductive layer 21 and the memory film 220 in the replacement process. In this case, as shown in FIGS. 2 and 3, for example, the blocking insulating film 21a is provided between each second conductive layer 21 and the charge trapping film 222. The cover insulating film 221 is not needed when the replacement process is not used in formation of the second conductive layers 21.

The charge trapping film 222 is provided between the blocking insulating film 21a and the tunnel insulating film 223 and between cover insulating film 221 and the tunnel insulating film 223. The charge trapping film 222, for example, contains silicon nitride, having a trap cite for trapping charges, inside its film. Of the charge trapping film 222, the portion, which is interposed between each conductive layer 21 functioning as a word line WL and the semiconductor body 210, forms a memory area of each memory cell MC as a charge trap. The threshold voltage of the memory cell MC varies depending on whether there are charges in the charge trap or on the amount of charges trapped in the charge trap. Accordingly, the memory cell MC can hold data.

The tunnel insulating film 223 is provided between the semiconductor body 210 and the charge trapping film 222. The tunnel insulating film 223, for example, contains silicon oxide, or silicon oxide and silicon nitride. The tunnel insulating film 223 is a potential barrier between the semiconductor body 210 and the charge trapping film 222. For example, when injecting electrons from the semiconductor body 210 to the charge trap (a write operation), and when injecting holes from the semiconductor body 210 to the charge trap (an erase operation), the electrons and holes each pass through (tunneling) the potential barrier of the tunnel insulating film 223.

The core layer 230 is embedded in the inner space of the tubular semiconductor body 210. The core layer 230 has a columnar shape, for example. The core layer 230, for example, contains silicon oxide and hence is insulative.

Figure 4:
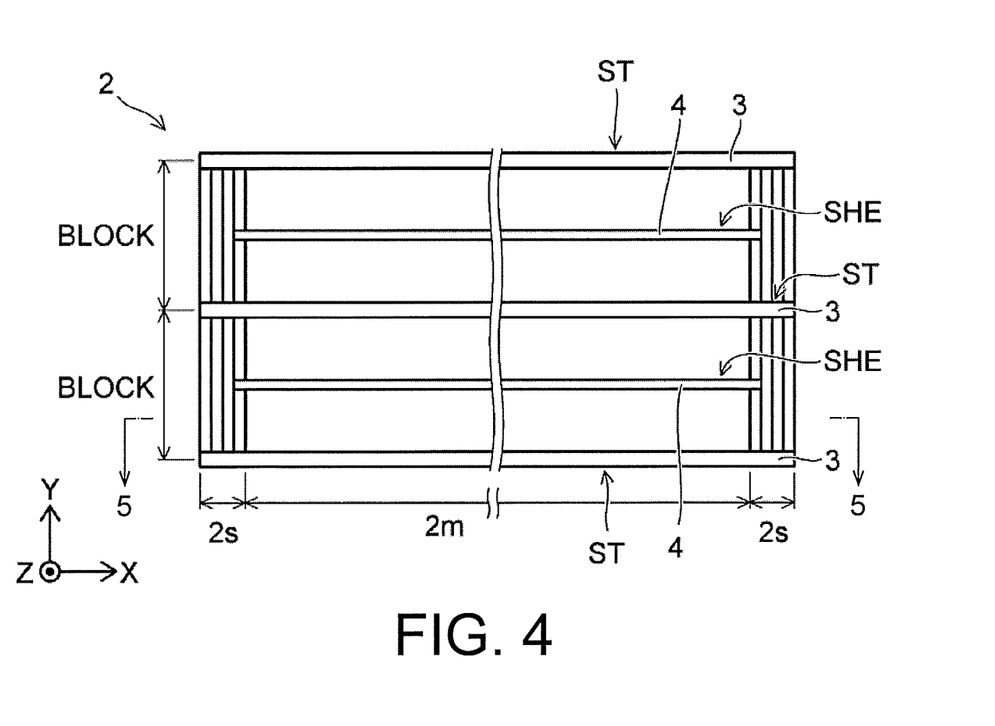
FIG. 4 is a schematic plan view exemplifying a semiconductor device according to the first embodiment.

FIG. 4 is a schematic plan view exemplifying a semiconductor device according to the first embodiment. Inside the stacked body 2, a plurality of deep slits ST and a plurality of shallow slits SHE are each provided. The deep slits ST extend in the X-axis direction inside the stacked body 2, penetrating the stacked body 2 from the upper end of the stacked body 2 to the base portion 1. A plate-like portion 3 is provided inside each deep slit ST. As for the plate-like portion 3, for example, silicon oxide is used. The plate-like portion 3 may contain a conductor (not shown) which is electrically isolated from the stacked body 2 but electrically connected to the upper conductive layer 13. The shallow slits SHE extend in the X-axis direction in the same manner as the deep slits ST, provided partway through the stacked body 2 from the upper end of the stacked body 2. Inside the shallow slits SHE, for example, insulators 4 are provided, respectively. The insulators 4 are, for example, silicon oxide.

The stacked body 2 includes staircase portions 2s and a memory portion 2m. The staircase portions 2s are provided at edges of the stacked body 2. The memory portion 2m is interposed between or surrounded by the staircase portions 2s. The deep slits ST are provided from the staircase portion 2s at one end of the stacked body 2 to the staircase portion 2s at the other end of the stacked body 2, through the memory portion 2m. The shallow slits SHE are provided at least in the memory portion 2m. The staircase portions 2s are each provided with a contact plug (not shown) connected to each second conductive layer 21 (word line WL).

In FIG. 4, a portion of the stacked body 2 interposed between two plate-like portions 3 is referred to as a block (BLOCK). The block forms, for example, the minimum unit in data erasure. Each insulator 4 is provided inside the block. The stacked body 2 between each plate-like portion 3 and the associated insulator 4 is referred to as a finger. The drain-side selection gate SGD is partitioned by fingers. Therefore, at the time of data writing or reading, one finger in the block can be set in a selected state by the drain-side selection gate SGD. Each of the plurality of first columnar portions CL is provided inside the memory hole MH provided in the stacked body 2 shown in FIGS. 2 and 3.

FIG. 5 is a schematic sectional view taken on line 5-5 of FIG. 4. As described above, the base portion 1 includes the substrate 10, the semiconductor elements (transistors) Tr, the first insulating film 11, the lower-layer wiring 11a, and the first conductive layers 12 and 13.

On the substrate 10, transistors Tr are provided as the semiconductor elements. The transistors Tr constitute a control circuit of a memory cell array MCA (for example, CMOS (Complementary Metal Oxide Semiconductor) circuit) provided thereabove. The first insulating film 11 contains, for example, silicon oxide (SiO2), to cover and protect the transistors Tr. Inside the first insulating film 11, the lower-layer wiring 11a is provided. The lower-layer wiring 11a is electrically connected to the semiconductor elements Tr located thereunder and also electrically connected to contact plugs C3 and C4, etc. located thereabove.

On the first insulating film 11, the first conductive layers 12 and 13 are provided. The first conductive layers 12 and 13 include the lower conductive layer 12 and the upper conductive layer 13. The lower conductive layer 12 is provided on the first insulating film 11. The upper conductive layer 13 is provided on the lower conductive layer 12. Accordingly, the first conductive layers 12 and 13 are formed as a stacked film. The lower conductive layer 12 contains a conductive metal (for example, tungsten) or metal silicide (for example, tungsten silicide (WSi)). The upper conductive layer 13 contains, for example, n-type doped polysilicon. Part of the upper conductive layer 13 may be undoped polysilicon. The upper conductive layer 13 and the lower conductive layer 12 are together referred to as the first conductive layers 12 and 13 as required. The first conductive layers 12 and 13 are connected to a lower end of each of the first columnar portions CL that constitute memory cells in cell regions Rcell, to function as common source line (BSL (Buried Source Line)). The base portion 1 has a configuration described above.

The stacked body 2 is provided on the base portion 1. In the stacked body 2, the memory cell array MCA is provided in each cell region Rcell as a first region. The memory cell array MCA has the plurality of first columnar portions CL and the plurality of second conductive layers 21. Each first columnar portion CL has the configuration explained with reference to FIGS. 1 to 3.

Between two cell regions Rcell adjacent to each other, a tap region Rtap is provided as a second region. The tap region Rtap is a region where contact plugs C4 and CP are provided. The contact plugs C4 and CP extend in the Z-axis direction.

The contact plugs C4 penetrate the second conductive layers 21 and the first conductive layers 12 and 13 to be connected to the lower-layer wiring 11a. The contact plugs C4 are provided for signal transmission between upper-layer wiring such as bit lines located above the cell regions Rcell and a control circuit of the base portion 1 located under the cell regions Rcell. The contact plug CP is electrically connected to the lower conductive layer 12 in the first conductive layers (BSL) 12 and 13. The contact plug CP is provided for transferring a source voltage to the first conductive layers (BSL) 12 and 13.

The plurality of second conductive layers 21 extend in the X-direction and are provided in the form of staircase in a staircase region Rstairs_1. In other words, the second conductive layers 21 are provided longer in the X-direction from the upper to lower layers. In the staircase region (third region) Rstairs_1 in the left side of FIG. 5, contact plugs CC each connected to the associated second conductive layer 21 are provided extending in the Z-direction. Since the second conductive layers 21 are provided in the form of staircase, each contact plug CC is connected to the surface of each of the plurality of second conductive layers 21. Word lines WL are provided on the contact plugs CC, extending in the Y-direction. Each word line WL is connected to the associated contact plug CC. In this way, the word line WL is electrically connected to each of the second conductive layers 21. As for the contact plugs CC and word lines WL, a conductive metal such as tungsten is used.

In a staircase region Rstairs_2 in the right side of FIG. 5, contact plugs C4 are provided extending in the Z-direction. The contact plugs C4 penetrate the staircase-like second conductive layers 21 and the first conductive layers 12 and 13, to be connected to the lower-layer wiring 11a. Around the contact plugs C4, an insulating film (for example, a silicon oxide film) is provided, so that the contact plugs C4 reach the lower-layer wiring 11a, as being isolated from the second conductive layers 21 and the first conductive layers 12 and 13. Accordingly, in the staircase region Rstairs_2, the contact plugs C4 can transfer signals between the semiconductor elements Tr and the memory cell arrays MCA. As for the contact plugs C4, a conductive metal such as tungsten is used.

The staircase regions Rstairs_1 and Rstairs_2, as a third region, are continuously connected to the cell regions Rcell, provided at the outer edges of the stacked body 2.

In a peripheral region Rperi of FIG. 5, the contact plug C3 is provided extending in the Z-direction. The peripheral region Rperi is a circuit region located around the stacked body 2, which is a peripheral circuit region of the cell regions Rcell and the staircase regions Rstairs of FIG. 5. The contact plug C3 penetrates an interlayer insulating film 25 and the lower conductive layer 12, to be connected to the lower-layer wiring 11a. Between the contact plug C3 and the lower conductive layer 12, an insulating film (for example, a silicon oxide film) is provided, so that the contact plug C3 reaches the lower-layer wiring 11a, as being isolated from the lower conductive layer 12. Accordingly, in the peripheral region Rperi, the contact plug C3 can perform signal transmission with the associated semiconductor element Tr. As for the contact plug C3, a conductive metal material such as tungsten is used.

Since the lower conductive layer 12 functions as a common source line (BSL), it is basically enough for the lower conductive layer 12 to be located under the memory cell arrays MCA and the contact plug CR Therefore, when considering the function as a source line only, it is enough for the lower conductive layer 12 to be provided in the cell regions Rcell and part of the tap region Rtap (a region of the contact plug CP), with no need to be provided in the staircase regions Rstairs_1 and Rstairs_2, the peripheral region Rperi, and the other part of the tap region Rtap (a region of the contact plugs C4). Moreover, in the case where the lower conductive layer 12 is, for example, metal silicide such as tungsten silicide, the adhesiveness between the interlayer insulating film 25 or first insulating film 11 and the lower conductive layer 12 is reduced. Therefore, when considering the adhesiveness between the interlayer insulating film 25 or first insulating film 11 and the lower conductive layer 12, it is preferable for the lower conductive layer 12 to be provided only at the places where it is required as a source line. In this case, it is preferable for the lower conductive layer 12 to be removed from the staircase regions Rstairs_1 and Rstairs_2, the peripheral region Rperi, and the other part of the tap region Rtap (the region of the contact plugs C4).

In contrast to the above, in the present embodiment, the lower conductive layer 12 remains, not only under the cell regions Rcell and the part of the tap region Rtap (the region of the contact plug CP), but also under the staircase regions Rstairs_1 and Rstairs_2, the peripheral region Rperi, and the other part of the tap region Rtap (the region of the contact plugs C4). In other words, the lower conductive layer 12 is provided, not only between the stacked body of the memory cell arrays MCA and the lower-layer wiring 11a, but also between the region of the contact plugs C4 in the tap region Rtap and the lower-layer wiring 11a, between the staircase regions Rstairs_1 and Rstairs_2 and the lower-layer wiring 11a, and the between the peripheral region Rperi and the lower-layer wiring 11a. Accordingly, in a formation process of memory holes MH, slits, etc., even if a dust is attached to any surface of the cell regions Rcell, the tap region Rtap, the staircase regions Rstairs, and the peripheral region Rperi of the stacked body 2, a hole pattern caused by the dust stops at the lower conductive layer 12 without reaching the lower-layer wiring 11a. Accordingly, the lower conductive layer 12 functions as an etching stopper to restrict an unintentional hole pattern caused by the dust from reaching the lower-layer wiring 11a.

The materials to be embedded in the first columnar portions CL, slits, etc. in the cell regions Rcell are not embedded in unintentional hole patterns formed in the peripheral region Rperi, the staircase regions Rstairs, and the tap region Rtap. Therefore, if an unintentional hole pattern of the peripheral region Rperi or the like reaches the lower-layer wiring 11a, the material (for example, tungsten) of the lower-layer wiring 11a is inevitably oxidized.

However, in the present embodiment, even if unintentional hole patterns are formed in the peripheral region Rperi, the staircase regions Rstairs, and the tap region Rtap, the hole patterns are blocked by the lower conductive layer 12, without reaching the lower-layer wiring 11a. Therefore, a metal material (for example, tungsten) used for the lower-layer wiring 11a is not oxidized in the following thermal oxidation process, so that expansion, cracks, etc. of the lower-layer wiring 11a can be restricted. In this case, it is required to use a metal compound, which is hardly oxidized more than the lower-layer wiring 11a, for the lower conductive layer 12. For example, for the lower conductive layer 12, a metal silicide such as tungsten silicide is used. The metal silicide is hardly oxidized more than the metal material itself. Accordingly, not only the oxidation, cracks, etc. of the lower-layer wiring 11a, but also the oxidation, cracks, etc. of the lower conductive layer 12 can be restricted. As described above, in the present embodiment, the lower conductive layer 12 has a function as a source line and also a function as a stopper of an unintentional hole pattern.

Moreover, in order to restrict a hole pattern caused by a dust from reaching the lower-layer wiring 11a, it is preferable for the lower conductive layer 12 to be provided up to the outside of the lower-layer wiring 11a when viewed from the Z-direction.

In the embodiment, for the lower conductive layer 12, for example, tungsten silicide is used. However, for the lower conductive layer 12, for example, titanium silicide may be used.

The upper conductive layer 13 is not provided under the peripheral region Rperi, although it is provided under the cell regions Rcell, the tap region Rtap, and the staircase regions Rstairs. As described above, basically, it is not required to provide a source line (BSL) in the peripheral region Rperi. Moreover, for the upper conductive layer 13, for example, polysilicon is used, so that the upper conductive layer 13 cannot function as an etching stopper of a contact hole. For this reason, the upper conductive layer 13 is not required to be provided in the peripheral region Rperi, and hence is removed from the peripheral region Rperi in advance.

Subsequently, with reference to FIGS. 6 and 7, openings OP3a to OP3f and OP4 which are formed in advance in the lower conductive layer 12 will be explained. In the present embodiment, by placing the lower conductive layer 12 in the peripheral region Rperi and the like, a hole pattern caused by a dust can be restricted from reaching the lower-layer wiring 11a. On the other hand, if the lower conductive layer 12 remains under the formation regions of the contact plugs C3 and C4, it is difficult for contact holes to penetrate the lower conductive layer 12 in the formation of the contact plugs C3 and C4. For this reason, in order to connect the contact plugs C3 and C4 to the lower-layer wiring 11a, it is required to remove in advance the lower conductive layer 12 present in the formation regions of the contact plugs C3 and C4. For example, after the deposition of the lower conductive layer 12, a lithography technique and an etching technique are used to remove in advance the lower conductive layer 12 present in the formation regions of the contact plugs C3 and C4. In this way, in the formation of the contact plugs C3 and C4, the contact holes can reach the lower-layer wiring 11a without being blocked by the lower conductive layer 12.

Figure 6:
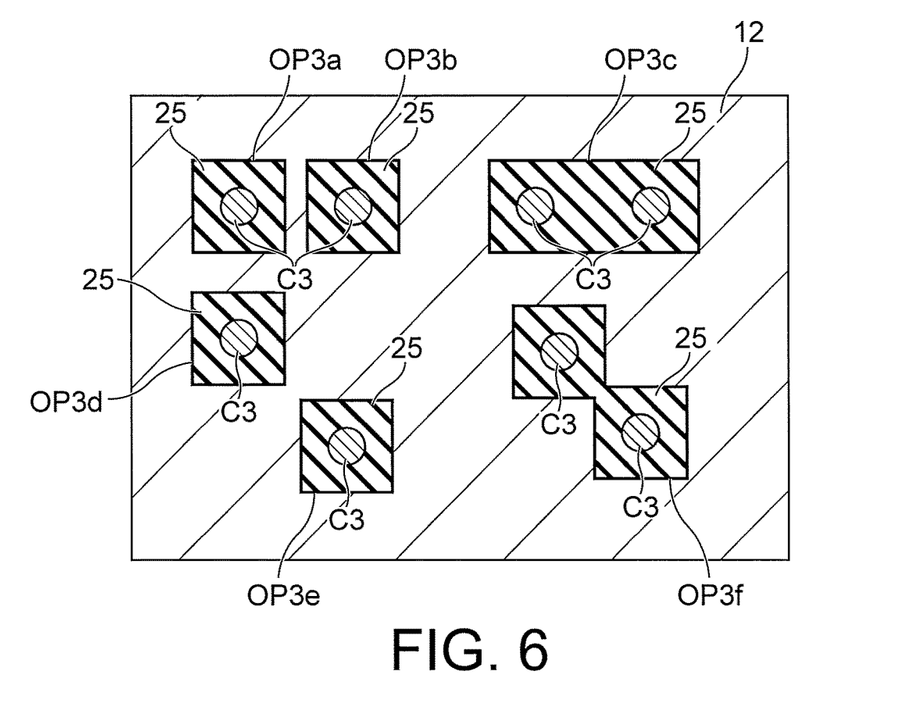
FIG. 6 is a schematic plan view showing an example of openings in a lower conductive layer.
Figure 7:
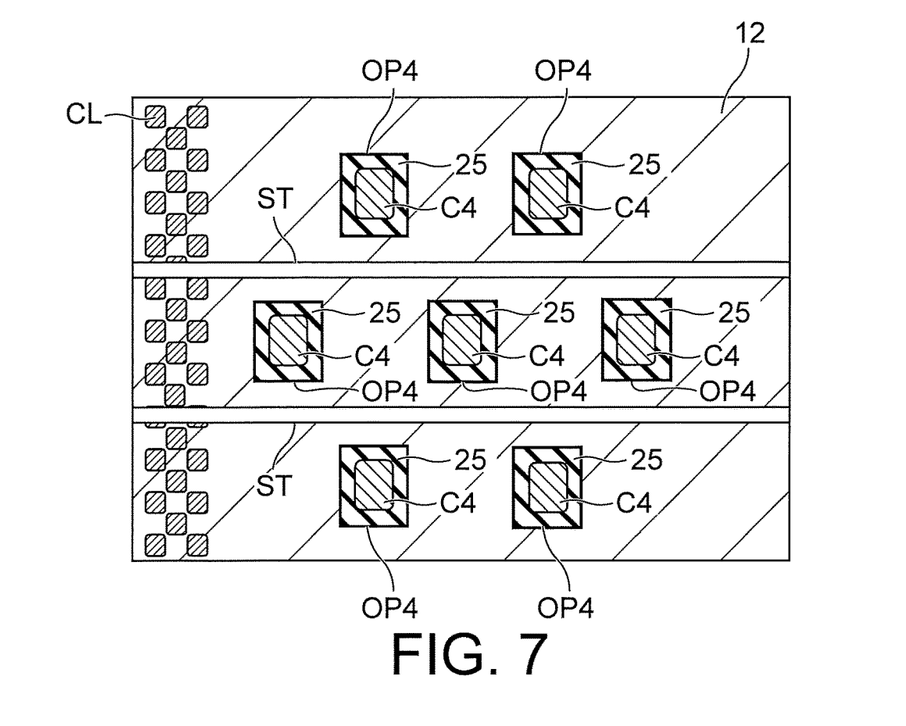
FIG. 7 is a schematic plan view showing an example of the openings in the lower conductive layer.

For example, FIGS. 6 and 7 are schematic plan views showing examples of openings in the lower conductive layer 12. FIGS. 6 and 7 show the planar surface of the lower conductive layer 12 cut at the plane parallel to the XY-plane.

FIG. 6 shows the openings OP3a to OP3f provided in the formation regions of contact plugs C3. The openings OP3a to OP3f are provided around the corresponding contact plugs C3, respectively. In the planar surface of FIG. 6, the openings OP3a to OP3f are formed larger than the contact plugs C3. Therefore, the contact plugs C3 can reach the lower-layer wiring 11a through the openings OP3a to OP3f without having a contact with the lower conductive layer 12. Between each contact plug C3 and the lower conductive layer 12, the interlayer insulating film 25 remains to electrically isolate the contact plug C3 and the lower conductive layer 12 from each other. The contact plugs C3 are arranged almost at the center of the openings OP3a to OP3f, respectively, or almost evenly arranged in the openings.

The openings OP3a to OP3f may be formed simultaneously with the formation of the lower conductive layer 12. Therefore, when the interlayer insulating film 25 is deposited, the openings OP3a to OP3f are filled with the material (for example, a silicon oxide film) of the interlayer insulating film 25. Then, the contact plugs C3 penetrate the interlayer insulating film 25 inside the openings OP3a to OP3f, respectively. In this way, the interlayer insulating film 25 is provided between each contact plug C3 and the lower conductive layer 12, so that a withstand voltage between the contact plugs C3 and the lower conductive layer 12 can be maintained.

When the distance between the contact plugs C3 adjacent to each other is relatively long, the openings are provided in the respective contact plugs C3. For example, in FIG. 6, the openings OP3a, OP3b, OP3d, and OP3e are separately provided in the respective contact plugs C3. On the other hand, when the distance between a plurality of contact plugs C3 adjacent to each other is relatively short, the openings corresponding to these contact plugs are connected to each other, so that one opening is provided for the plurality of contact plugs C3. For example, in FIG. 6, the openings OP3c and OP3f are each provided for two contact plugs C3.

A plurality of openings adjacent to each other may be connected to each other when the distance between the plurality of openings is shorter than the length of one side of one opening or than one half of that length. It is a matter of course that the plurality of openings adjacent to each other may be connected to each other in accordance with other conditions.

FIG. 7 shows the openings OP4 provided in the formation regions of the contact plugs C4. The openings OP4 are provided around the corresponding contact plugs C4, respectively, formed larger than the contact plugs C4 in the plane of FIG. 7. Therefore, the contact plugs C4 can reach the lower-layer wiring 11a through the openings OP4 without having a contact with the lower conductive layer 12. Between the contact plugs C4 and the lower conductive layer 12, the interlayer insulating film 25 remains to electrically isolate the contact plugs C4 and the lower conductive layer 12 from each other. The contact plugs C4 are arranged almost at the center of the openings OP4, respectively. The sign CL denotes each first columnar portion CL shown in FIGS. 1 to 3 and the sign ST denotes each slit ST.

In the same manner as the openings OP3a to OP3f, the openings OP4 are formed simultaneously with the formation of the lower conductive layer 12. Therefore, when the interlayer insulating film 25 is deposited, the openings OP4 are filled with the material (for example, a silicon oxide film) of the interlayer insulating film 25. Then, the contact plugs C4 penetrate the interlayer insulating film 25 inside the openings OP4, respectively. In this way, the interlayer insulating film 25 is provided between each contact plug C4 and the lower conductive layer 12, so that a withstand voltage between the contact plugs C4 and the lower conductive layer 12 can be maintained.

The contact plugs C4 are arranged systematically. The openings OP4 are provided separately for the respective contact plugs C4. When the distance between a plurality of openings OP4 adjacent to each other is relatively short, the openings OP4 may be connected to each other, in the same manner as the openings OP3c and OP3f.

A manufacturing method of the semiconductor storage device 100 according to the first embodiment can be achieved by changing the mask pattern of the lower conductive layer 12 in a lithography process in a known manufacturing method. Therefore, the detailed explanation of the manufacturing method is omitted.

Second Embodiment

Figure 8:
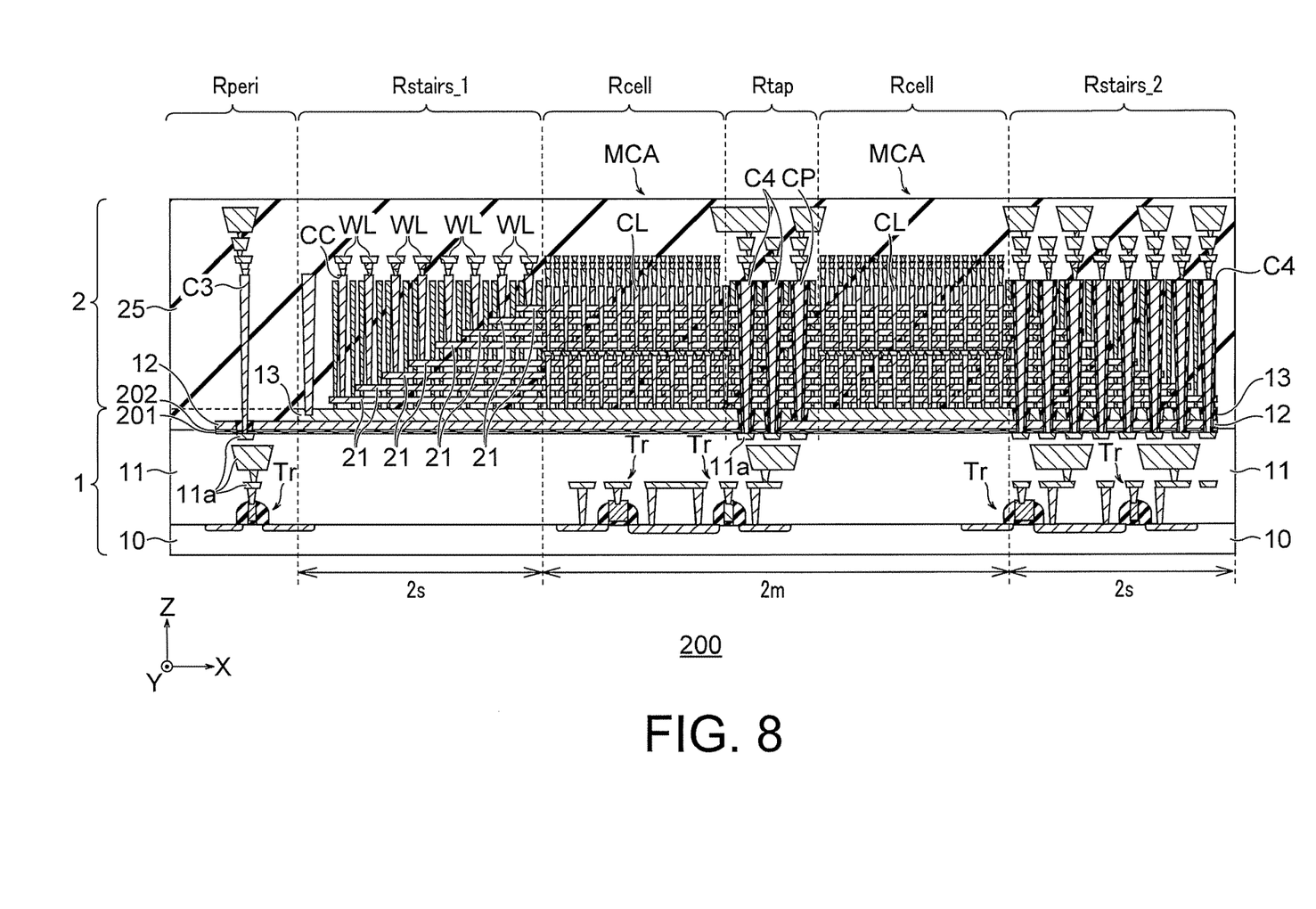
FIG. 8 is a schematic sectional view showing a configuration example of a semiconductor storage device according to a second embodiment.

FIG. 8 is a schematic sectional view showing a configuration example of a semiconductor storage device 200 according to a second embodiment. The semiconductor storage device 200 according to the second embodiment is provided further with a silicon nitride film 201 and a metal oxide film 202.

The silicon nitride film 201 is provided between the lower-layer wiring 11a and the lower conductive layer 12. The silicon nitride film 201 functions as a hydrogen barrier, so that hydrogen, which is generated when tungsten is embedded in the stacked body 2, is not diffused to the base portion 1.

The metal oxide film 202 is provided between the silicon nitride film 201 and the lower-layer wiring 11a. As for the metal oxide film 202, for example, aluminum oxide is used. In the same manner as the lower conductive layer 12, the metal oxide film 202 is provided between the stacked body of the memory cell arrays MCA and the lower-layer wiring 11a, between the region of the contact plugs C4 in the tap region Rtap and the lower-layer wiring 11a, between the staircase regions Rstairs_1 and Rstairs_2 and the lower-layer wiring 11a, and the between the peripheral region Rperi and the lower-layer wiring 11a. Accordingly, together with the lower conductive layer 12, the metal oxide film 202 functions as an etching stopper of a hole pattern caused by a dust. As a result, the hole pattern caused by the dust can further be restricted from reaching the lower-layer wiring 11a.

The metal oxide film 202 has the same plane pattern as the lower conductive layer 12. In other words, the metal oxide film 202 has openings OP3a to OP3f and OP4 as explained with reference to FIGS. 6 and 7, and provided up to the outside of the lower-layer wiring 11a when viewed from the Z-direction. Accordingly, the contact plugs C3 and C4 can penetrate the openings OP3a to OP3f and OP4, respectively, to be connected to the lower-layer wiring 11a.

The other configurations of the second embodiment may be the same as those of the first embodiment. Accordingly, the same effects as in the first embodiment can also be obtained in the second embodiment.

Third Embodiment

Figure 9:
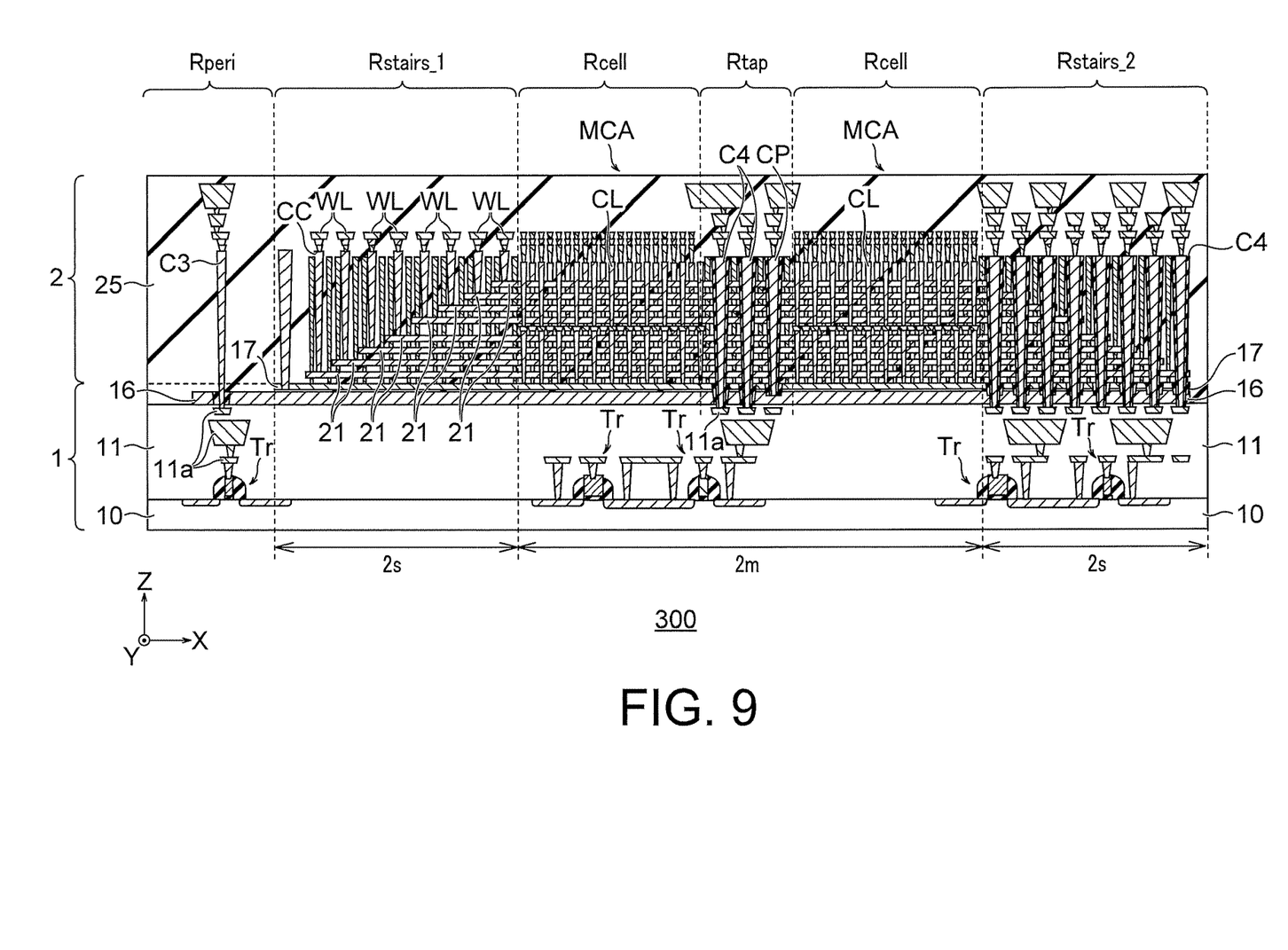
FIG. 9 is a schematic sectional view showing a configuration example of a semiconductor storage device according to a third embodiment.

FIG. 9 is a schematic sectional view showing a configuration example of a semiconductor storage device 300 according to a third embodiment. The semiconductor storage device 300 according to the third embodiment is not provided with the lower conductive layer 12 made of a metal compound, but provided with a relatively thick single-layer polysilicon layer 16 as a first conductive layer. The polysilicon layer 16 is, for example, n-type doped polysilicon, having a thickness of about 500 nm. Although the polysilicon layer 16 does not contain a metal compound, since formed having a relatively large thickness, the polysilicon layer 16 can be used as an etching stopper of a contact hole.

The polysilicon layer 16 is provided between the lower-layer wiring 11a and a stopper film 17. The stopper film 17 is used as an etching stopper in the formation of the memory holes MH, slits, etc. The stopper film 17 may or may not function as a source line (BSL). For the stopper film 17, for example, polysilicon is used.

The polysilicon layer 16 has the same plane pattern as the lower conductive layer 12 of the first embodiment. In other words, the polysilicon layer 16 has openings OP3a to OP3f and OP4 as explained with reference to FIGS. 6 and 7, and provided up to the outside of the lower-layer wiring 11a when viewed from the Z-direction. The polysilicon layer 16 is provided between the stacked body of the memory cell arrays MCA and the lower-layer wiring 11a, between the region of the contact plugs C4 in the tap region Rtap and the lower-layer wiring 11a, between the staircase regions Rstairs_1 and Rstairs_2 and the lower-layer wiring 11a, and the between the peripheral region Rperi and the lower-layer wiring 11a. The other configurations of the third embodiment may be the same as those of the first embodiment. Accordingly, even if a dust is attached to any surface of the tap region Rtap, the staircase regions Rstairs, and the peripheral region Rperi, the polysilicon layer 16 functions as an etching stopper of a hole pattern caused by the dust. As a result, the hole pattern caused by the dust can be restricted from reaching the lower-layer wiring 11a.

In the manufacturing process of the semiconductor storage device 300, the polysilicon layer 16 is formed thick so as to function as an etching stopper. Therefore, in the formation regions of the contact plugs C3 and C4, it is required to remove the polysilicon layer 16 in advance before the formation of the contact plugs C3 and C4, in the same manner as the lower conductive layer 12. For example, in the same manner as the lower conductive layer 12 of the first embodiment, in the formation regions of the contact plugs C3 and C4, the openings OP3a to OP3f and OP4 are formed simultaneously with the formation of the polysilicon layer 16. Thereafter, the interlayer insulating film 25 is embedded in the formation regions of the contact plugs C3 and C4 from which the polysilicon layer 16 has been removed. Therefore, the contact holes of the contact plugs C3 and C4 can be formed so as to penetrate the stacked body 2 or the interlayer insulating film 25 to reach the lower conductive layer 12. In this case, etching of the contact holes can penetrate the openings OP3a to OP3f and OP4 to reach the lower conductive layer 12, without being blocked by the polysilicon layer 16. The interlayer insulating film 25 remains between the polysilicon layer 16 and the contact plugs C3 and C4. Accordingly, the contact plugs C3 and C4 can be connected to the lower conductive layer 12, in the state of being isolated from the polysilicon layer 16. As described above, the contact plugs C3 and C4 can be easily formed in the formation regions of the contact plugs C3 and C4, by providing the openings OP3a to OP3f and OP4 in advance in the polysilicon layer 16.

Fourth Embodiment

In the third embodiment, the thick polysilicon layer 16 extends in the vicinity of the lower-layer wiring 11a and the semiconductor element Tr in the peripheral region. In this case, parasitic capacitance between the peripheral circuit formed by the semiconductor element Tr and the like, and the polysilicon layer 16 may adversely affect the operation of the peripheral circuit.

Figure 10:
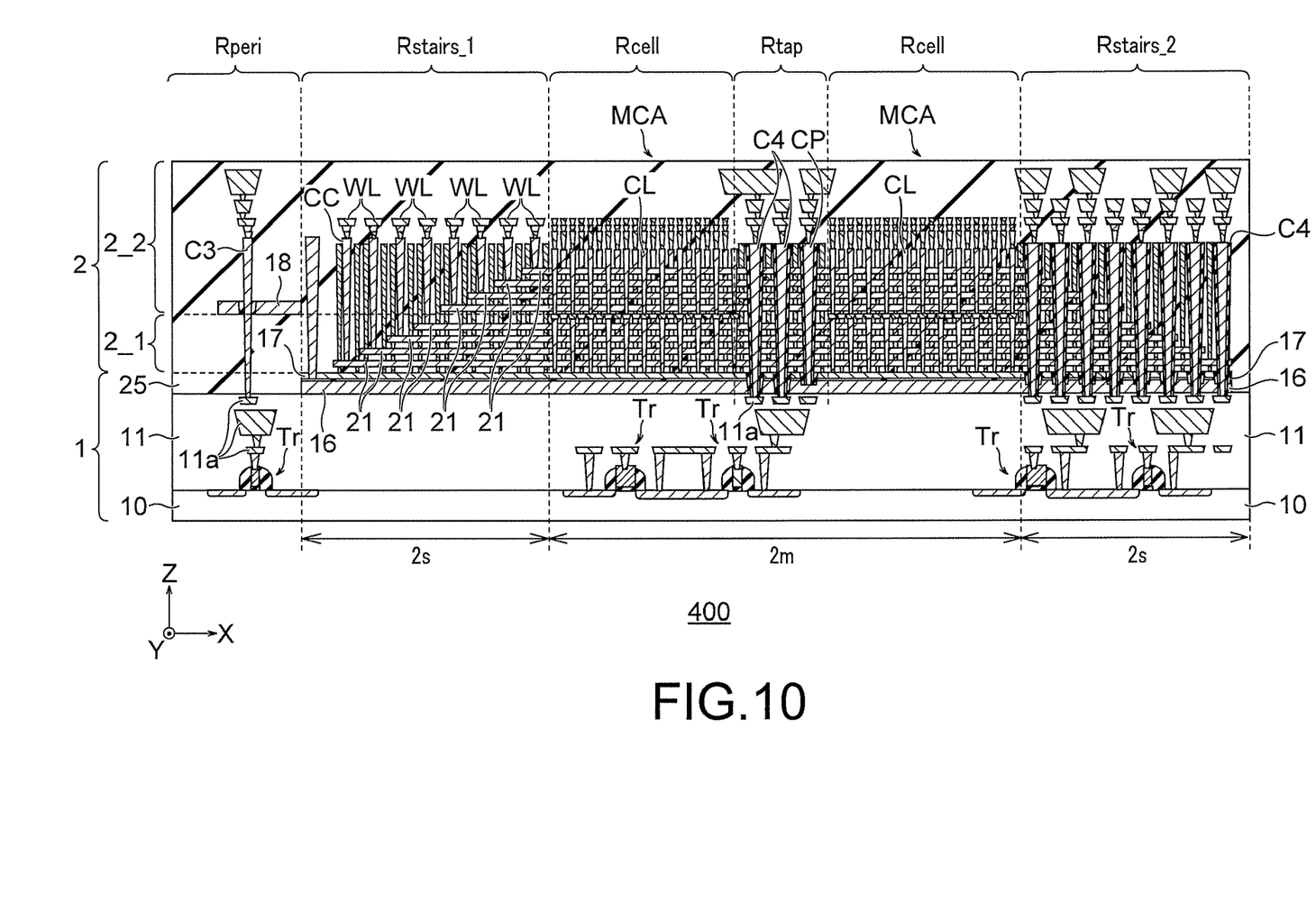
FIG. 10 is a schematic sectional view showing a configuration example of a semiconductor storage device according to a fourth embodiment.

For the reason above, in a fourth embodiment, the polysilicon layer 16 does not extend to the peripheral region Rperi. Instead, above the polysilicon layer 16, another polysilicon layer 18 is provided in the peripheral region Rperi.

FIG. 10 is a schematic sectional view showing a configuration example of a semiconductor storage device 400 according to the fourth embodiment. According to the fourth embodiment, the polysilicon layer 16 does not extend to the peripheral region Rperi, and instead, the other polysilicon layer 18 is provided above the polysilicon layer 16. The polysilicon layer 18 is provided corresponding to the contact plug C3 in the peripheral region Rperi. The other configurations of the fourth embodiment may be the same as those of the third embodiment.

In the present embodiment, the stacked body 2 is formed separately in a lower portion 2_1 and an upper portion 2_2. Therefore, after the first columnar portions CL are formed in the lower portion 2_1, the first columnar portions CL are further formed in the upper portion 2_2.

The polysilicon layer 18 is formed on the interlayer insulating film 25 after the lower portion 2_1 of the stacked body 2 is formed. In this case, the polysilicon layer 18 may be formed in the same layout as shown in the plan view of FIG. 6. Therefore, the polysilicon layer 18 is removed from the cell regions Rcell, the tap region Rtap, and staircase regions Rstairs. Moreover, the polysilicon layer 18 in the openings OP3a to OP3f is also removed.

Thereafter, the upper portion 2_2 of the stacked body 2 is formed. The polysilicon layer 18 is covered with the interlayer insulating film 25 after the formation of the upper portion 2_2 of the stacked body 2.

As described above, the polysilicon layer 18 in the peripheral region Rperi is located above the polysilicon layer 16 in the other cell regions Rcell, tap region Rtap, and staircase regions Rstairs. Accordingly, the polysilicon layers 16 and 18 are both apart from the lower-layer wiring 11a in the peripheral region Rperi and from the semiconductor element Tr also in the peripheral region Rperi, so that the influence of parasitic capacitance to the peripheral circuit can be restricted.

The polysilicon layer 18 functions as an etching stopper of a hole pattern caused by a dust even if the dust is attached in the peripheral region Rperi. Accordingly, the same effects as in the third embodiment can also be obtained in the fourth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device, comprising:
a base portion including a substrate, semiconductor elements provided on the substrate, lower-layer wirings provided above the semiconductor elements, and a first conductive layer provided above the lower-layer wirings and made of a metal compound or polycrystal silicon;
a stacked body provided above the first conductive layer, the stacked body including a plurality of second conductive layers and a plurality of first insulating films stacked alternately in a first direction, and a second insulating film provided in a second direction of the plurality of second conductive layers, the second direction crossing the first direction; and
a first columnar portion including a semiconductor body and extending in the first direction of the stacked body and electrically connected to the first conductive layer,
a memory film provided between the semiconductor body and the plurality of second conductive layers,
wherein the stacked body comprises:
a first region provided with the first columnar portion; and
a second region having a first contact extending inside the second insulating film in the first direction and connected to a first wiring among the lower-layer wirings,
the first conductive layer is provided between the first region of the stacked body and the lower-layer wirings, and between the second region of the stacked body and the lower-layer wirings, and
the first contact extends through the first conductive layer and is insulated from the first conductive layer.

2. The semiconductor storage device according to claim 1, wherein the stacked body comprises:
a plurality of the first regions provided with the first columnar portion; and
a third region located between the first regions adjacent to each other,
wherein the first conductive layer is provided, not only between the first regions and the lower-layer wirings, but also between the third region and the lower-layer wirings.

3. The semiconductor storage device according to claim 1, wherein the stacked body comprises a fourth region having a contact connected to each of the second conductive layers, and
wherein the first conductive layer is also provided between the fourth region and the lower-layer wirings.

4. The semiconductor storage device according to claim 2, wherein the stacked body comprises a fourth region having a contact connected to each of the second conductive layers, and
wherein the first conductive layer is also provided between the fourth region and the lower-layer wirings.

5. The semiconductor storage device according to claim 1, wherein a metal material is used for the lower-layer wirings, and a metal compound hardly oxidized more than the lower-layer wirings is used for the first conductive layer.

6. The semiconductor storage device according to claim 2, wherein a metal material is used for the lower-layer wirings, and a metal compound hardly oxidized more than the lower-layer wirings is used for the first conductive layer.

7. The semiconductor storage device according to claim 3, wherein a metal material is used for the lower-layer wirings, and a metal compound hardly oxidized more than the lower-layer wirings is used for the first conductive layer.

8. The semiconductor storage device according to claim 1, wherein tungsten silicide or titanium nitride is used for the first conductive layer.

9. The semiconductor storage device according to claim 2, wherein tungsten silicide or titanium nitride is used for the first conductive layer.

10. The semiconductor storage device according to claim 3, wherein tungsten silicide or titanium nitride is used for the first conductive layer.

11. The semiconductor storage device according to claim 1, wherein the first conductive layer is provided up to an outside of the lower-layer wirings when viewed from the first direction of the stacked body.

12. The semiconductor storage device according to claim 2, wherein the first conductive layer is provided up to an outside of the lower-layer wirings when viewed from the first direction of the stacked body.

13. The semiconductor storage device according to claim 3, wherein the first conductive layer is provided up to an outside of the lower-layer wirings when viewed from the first direction of the stacked body.

14. The semiconductor storage device according to claim 1 further comprising:

a silicon nitride film provided between the lower-layer wirings and the first conductive layer; and a metal oxide film provided between the silicon nitride film and the first conductive layer.

15. The semiconductor storage device according to claim 14, wherein the metal oxide film is provided up to an outside of the lower-layer wirings when viewed from the first direction of the stacked body.

* * * * *